(12) United States Patent
Lee et al.

(10) Patent No.: US 10,877,584 B2
(45) Date of Patent: *Dec. 29, 2020

(54) DISPLAY DEVICE WITH TOUCH SENSOR

(71) Applicant: LG Display Co., Ltd., Seoul (KR)

(72) Inventors: Jae-Won Lee, Goyang-si (KR); Seung-Hee Nam, Paju-si (KR); Min-Joo Kim, Seoul (KR); Kwon-Shik Park, Seoul (KR); Jae-Young Oh, Goyang-si (KR); Deuk-Su Lee, Goyang-si (KR); Bu-Yeol Lee, Goyang-si (KR); Eun-Hye Lee, Paju-si (KR); Tae-hwan Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/438,278

(22) Filed: Feb. 21, 2017

(65) Prior Publication Data

US 2018/0095566 A1 Apr. 5, 2018

(30) Foreign Application Priority Data

Sep. 30, 2016 (KR) ........................ 10-2016-0126761

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/047* (2013.01); *G06F 3/0416* (2013.01); *H01L 27/322* (2013.01); *H01L 27/323* (2013.01); *H01L 27/3213* (2013.01); *H01L 27/3244* (2013.01); *H01L 51/5253* (2013.01);
(Continued)

(58) Field of Classification Search
CPC .................................. G06F 3/041; G06F 3/044
See application file for complete search history.

(56) References Cited

U.S. PATENT DOCUMENTS 9,123,497 B2 9/2015 Cho et al.
9,184,409 B2 11/2015 Ho-Won et al.
(Continued)

FOREIGN PATENT DOCUMENTS

CN 104503609 4/2015
EP 2447812 5/2012
(Continued)

OTHER PUBLICATIONS

Office Action for Korean Patent Application No. KR 10-2016-0126761, dated Dec. 14, 2017, 8 Pages, (With Concise Explanation of Relevance).
(Continued)

*Primary Examiner* — Amy Onyekaba
(74) *Attorney, Agent, or Firm* — Fenwick & West LLP

(57) ABSTRACT

Disclosed is an organic light emitting display having reduced thickness and weight. The organic light emitting display with a touch sensor removes the necessity of an additional adhesion process by directly forming a touch sensor including a touch sensing line and a touch driving line and a color filter on the encapsulation layer covering a light emitting device, thereby simplifying a manufacturing process and reducing manufacturing costs.

24 Claims, 12 Drawing Sheets

(51) Int. Cl.
*G06F 3/047* (2006.01)
*H01L 27/32* (2006.01)
*H01L 51/52* (2006.01)
*H01L 51/56* (2006.01)
*G02F 1/1333* (2006.01)

(52) U.S. Cl.
CPC .......... *H01L 51/5284* (2013.01); *H01L 51/56* (2013.01); *G02F 1/13338* (2013.01); *G06F 2203/04103* (2013.01); *G06F 2203/04111* (2013.01); *G06F 2203/04112* (2013.01); *H01L 2227/323* (2013.01)

(56) References Cited

U.S. PATENT DOCUMENTS

| | | | | |
|---|---|---|---|---|
| 9,851,840 | B2* | 12/2017 | Hwang | G06F 3/044 |
| 2010/0103121 | A1* | 4/2010 | Kim | G06F 3/0412 |
| | | | | 345/173 |
| 2010/0136868 | A1* | 6/2010 | Chien | G06F 3/0412 |
| | | | | 445/24 |
| 2012/0026107 | A1* | 2/2012 | Kim | G06F 3/044 |
| | | | | 345/173 |
| 2012/0105344 | A1* | 5/2012 | Ko | G06F 3/0412 |
| | | | | 345/173 |
| 2013/0044384 | A1* | 2/2013 | Kim | G02B 5/20 |
| | | | | 359/885 |
| 2013/0106727 | A1* | 5/2013 | Juan | G06F 3/041 |
| | | | | 345/173 |
| 2014/0062916 | A1* | 3/2014 | Hong | G06F 3/0416 |
| | | | | 345/173 |
| 2014/0117324 | A1* | 5/2014 | Kim | G06F 1/1652 |
| | | | | 257/40 |
| 2014/0132488 | A1* | 5/2014 | Kim | G06F 1/1637 |
| | | | | 345/76 |
| 2014/0152912 | A1* | 6/2014 | Lee | G06F 3/0412 |
| | | | | 349/12 |
| 2014/0160072 | A1* | 6/2014 | Inagaki | G06F 3/0418 |
| | | | | 345/174 |
| 2014/0183478 | A1* | 7/2014 | Lee | H01L 27/323 |
| | | | | 257/40 |
| 2014/0184937 | A1* | 7/2014 | Lim | G06F 3/044 |
| | | | | 349/12 |
| 2014/0198268 | A1* | 7/2014 | Sugita | G06F 3/0412 |
| | | | | 349/12 |
| 2014/0232956 | A1* | 8/2014 | Kwon | H01L 27/3276 |
| | | | | 349/12 |
| 2014/0313435 | A1* | 10/2014 | Cho | G06F 3/0446 |
| | | | | 349/12 |
| 2014/0320759 | A1* | 10/2014 | Jeong | G06F 1/1692 |
| | | | | 349/12 |
| 2015/0009422 | A1* | 1/2015 | Tung | G06F 3/0446 |
| | | | | 349/12 |
| 2015/0062465 | A1* | 3/2015 | Her | G06F 3/0446 |
| | | | | 349/12 |
| 2015/0084912 | A1* | 3/2015 | Seo | G06F 3/0412 |
| | | | | 345/174 |
| 2015/0144909 | A1* | 5/2015 | Byun | H01L 51/5253 |
| | | | | 257/40 |
| 2015/0160767 | A1* | 6/2015 | Song | G06F 3/044 |
| | | | | 345/174 |
| 2015/0185928 | A1* | 7/2015 | Son | G06F 3/016 |
| | | | | 345/174 |
| 2015/0185942 | A1* | 7/2015 | Kim | G06F 3/0412 |
| | | | | 345/173 |
| 2015/0185960 | A1* | 7/2015 | Kim | G06F 3/04164 |
| | | | | 345/175 |
| 2015/0331529 | A1* | 11/2015 | Lee | G06F 3/0445 |
| | | | | 345/174 |
| 2015/0370356 | A1* | 12/2015 | Hwang | G06F 3/041 |
| | | | | 345/173 |
| 2015/0378486 | A1* | 12/2015 | Yu | G06F 3/04166 |
| | | | | 345/174 |
| 2016/0093827 | A1* | 3/2016 | Han | H01L 27/3244 |
| | | | | 257/40 |
| 2016/0117031 | A1* | 4/2016 | Han | G06F 3/0412 |
| | | | | 345/174 |
| 2016/0124557 | A1* | 5/2016 | Choi | G06F 1/1626 |
| | | | | 345/173 |
| 2016/0126498 | A1* | 5/2016 | Kim | H01L 51/5234 |
| | | | | 257/40 |
| 2016/0139705 | A1* | 5/2016 | Park | G06F 3/044 |
| | | | | 345/174 |
| 2016/0170524 | A1* | 6/2016 | Kim | G06F 3/0445 |
| | | | | 345/174 |
| 2016/0174376 | A1* | 6/2016 | Oh | H05K 1/111 |
| | | | | 361/749 |
| 2016/0179229 | A1* | 6/2016 | Ahn | H01L 27/323 |
| | | | | 345/173 |
| 2016/0181345 | A1* | 6/2016 | Lee | H05K 1/028 |
| | | | | 257/40 |
| 2016/0209971 | A1* | 7/2016 | Kim | G06F 3/044 |
| 2016/0260780 | A1* | 9/2016 | Kim | H01L 51/0097 |
| 2016/0328039 | A1* | 11/2016 | Lin | G06F 3/044 |
| 2016/0378224 | A1* | 12/2016 | Kwon | H01L 27/322 |
| | | | | 345/174 |
| 2017/0262109 | A1* | 9/2017 | Choi | G06F 3/0412 |
| 2017/0308196 | A1* | 10/2017 | Jeong | H01L 27/3244 |
| 2018/0018034 | A1* | 1/2018 | Choi | G06F 1/1692 |
| 2018/0039360 | A1* | 2/2018 | Akimoto | G06F 3/0412 |
| 2018/0040672 | A1* | 2/2018 | Park | G06F 1/1652 |

FOREIGN PATENT DOCUMENTS

| | | |
|---|---|---|
| EP | 2843519 | 3/2015 |
| KR | 20120042438 | 5/2012 |
| KR | 10-2014-0022223 A | 2/2014 |
| KR | 20140113541 | 9/2014 |
| KR | 10-2015-0079265 A | 7/2015 |
| KR | 20160106825 | 9/2016 |
| TW | 201114028 | 4/2011 |
| TW | I455301 | 10/2014 |
| TW | I465986 | 12/2014 |
| TW | 201627844 | 8/2016 |
| WO | WO 2013094919 | 6/2013 |

OTHER PUBLICATIONS

Office Action for Taiwan Patent Application No. TW 106104163, dated Jul. 5, 2017, 22 Pages (With English Translation).
Extended European Search Report for European Patent Application No. EP 17155972.7, dated Aug. 21, 2017, 9 Pages.
Korean Intellectual Property Office, Office Action, KR Patent Application No. 10-2016-0126761, dated Jun. 14, 2018, eight pages (with concise explanation of relevance).
Korean Intellectual Property Office, Office Action, KR Patent Application No. 10-2019-0134412, dated Jan. 3, 2020, 12 pages.

* cited by examiner

DISPLAY DEVICE WITH TOUCH SENSOR

CROSS REFERENCE TO RELATED APPLICATIONS

This application claims the benefit of Korean Patent Application No. 10-2016-0126761, filed on Sep. 30, 2016, which is hereby incorporated by reference as if fully set forth herein.

BACKGROUND

Field

An embodiment of the present disclosure relates to an organic light emitting display device with a touch sensor and a method of manufacturing the same, and more particularly, to an organic light emitting display device with a touch sensor and a method of manufacturing the same to simplify a manufacturing process and reduce manufacturing costs.

Discussion of the Related Art

A touchscreen is a device for inputting a user's command by selecting an instruction shown on a screen of a display or the like with the hand of the user or an object. That is, the touchscreen converts a contact position thereof that directly contacts the hand of the user or the object into an electrical signal and receives the instruction selected in the contact position as an input signal. Such a touchscreen can replace an additional input device such as a keyboard or mouse which is operated in connection with a display and application thereof is thus gradually expanding.

In general, such a touchscreen is often attached to the front surface of a display panel such as a liquid crystal display panel or an organic electroluminescent display panel through an adhesive agent. In this case, there are problems of complicated overall process and increased costs resulting from an additional attachment process, because the touchscreen is separately produced and is attached to the front surface of the display panel.

SUMMARY

One embodiment of the present disclosure is an organic light emitting display device with a touch sensor that substantially obviate one or more problems due to limitations and disadvantages of the related art.

An object of at least one embodiment of the present disclosure is to provide an organic light emitting display device with a touch sensor to simplify a manufacturing process and reduce manufacturing costs.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In one embodiment, an organic light emitting display device with a touch sensor removes the necessity of an additional adhesion process by directly disposing a touch sensor including a touch sensing line and a touch driving line and a color filter on an encapsulation layer disposed to cover the light emitting device, thereby simplifying the manufacturing process and reducing manufacturing costs.

It is to be understood that both the foregoing general description and the following detailed description of the present disclosure are exemplary and explanatory and are intended to provide further explanation of the disclosure as claimed.

In one embodiment, a display device comprises at least one light emitting device on a substrate. An encapsulation layer is on the at least one light emitting device. An insulating layer is between the substrate and the encapsulation layer. A touch sensor is on the encapsulation layer. The touch sensor has a touch sensing line and a touch driving line intersecting each other. A touch pad is electrically connected to the touch sensor and is in contact with the insulating layer.

In one embodiment, a display device comprises at least one light emitting device on a substrate. An encapsulation layer is on the at least one light emitting device. A touch sensor is on the encapsulation layer. The touch sensor has a touch sensing line and a touch driving line intersecting each other. A routing line is electrically connected to the touch sensor. The routing line covers a side surface of the encapsulation layer.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principles of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being "on" or "under" another element, not only can it be directly on or under another element, but it can also be indirectly on or under another element via an intervening element.

Hereinafter, embodiments of the present disclosure will be described with reference to the annexed drawings in detail.

Figure 1:
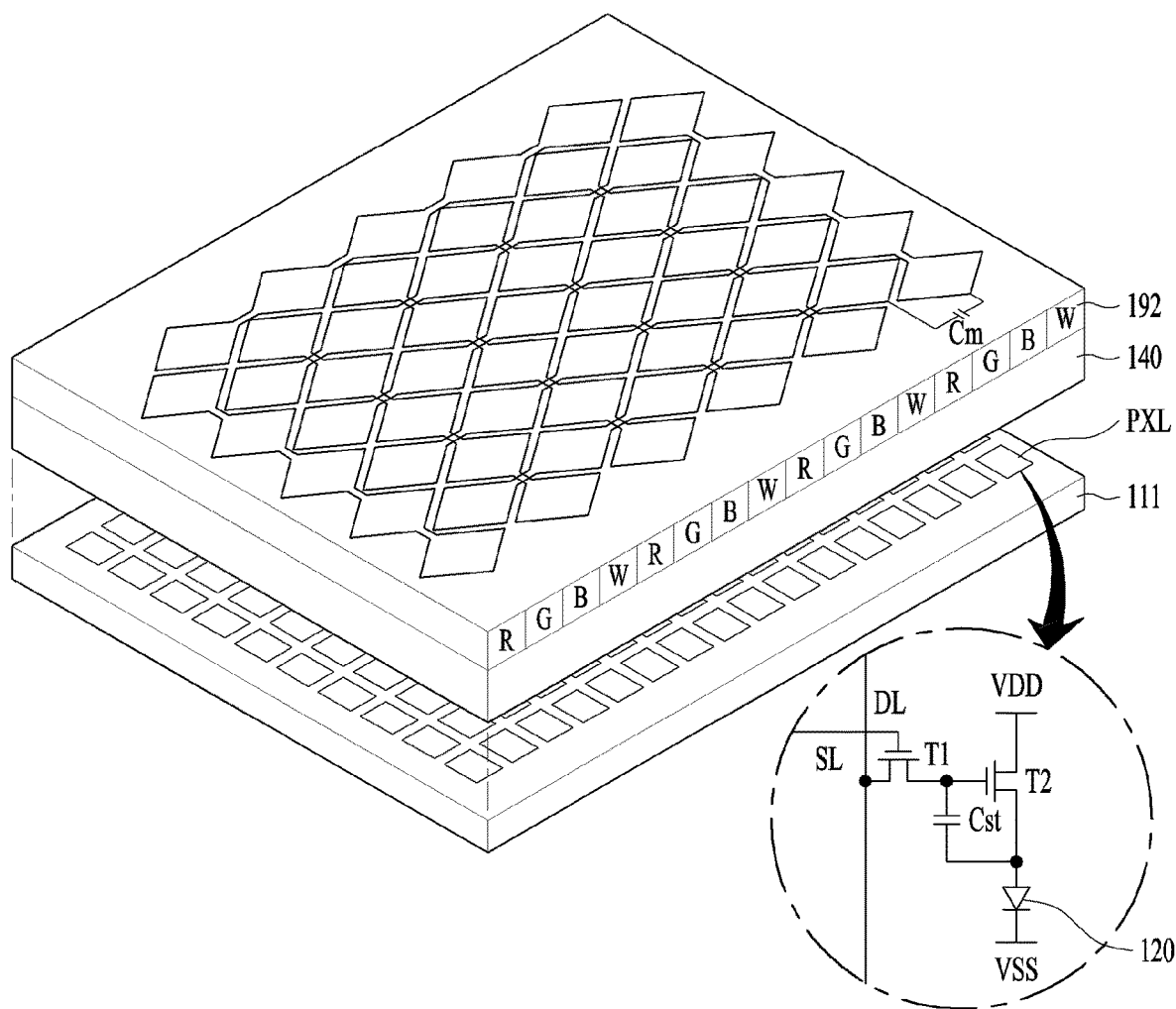
FIG. 1 is a perspective view illustrating an organic light emitting display device with a touch sensor according to a first embodiment of the present disclosure.
Figure 2:
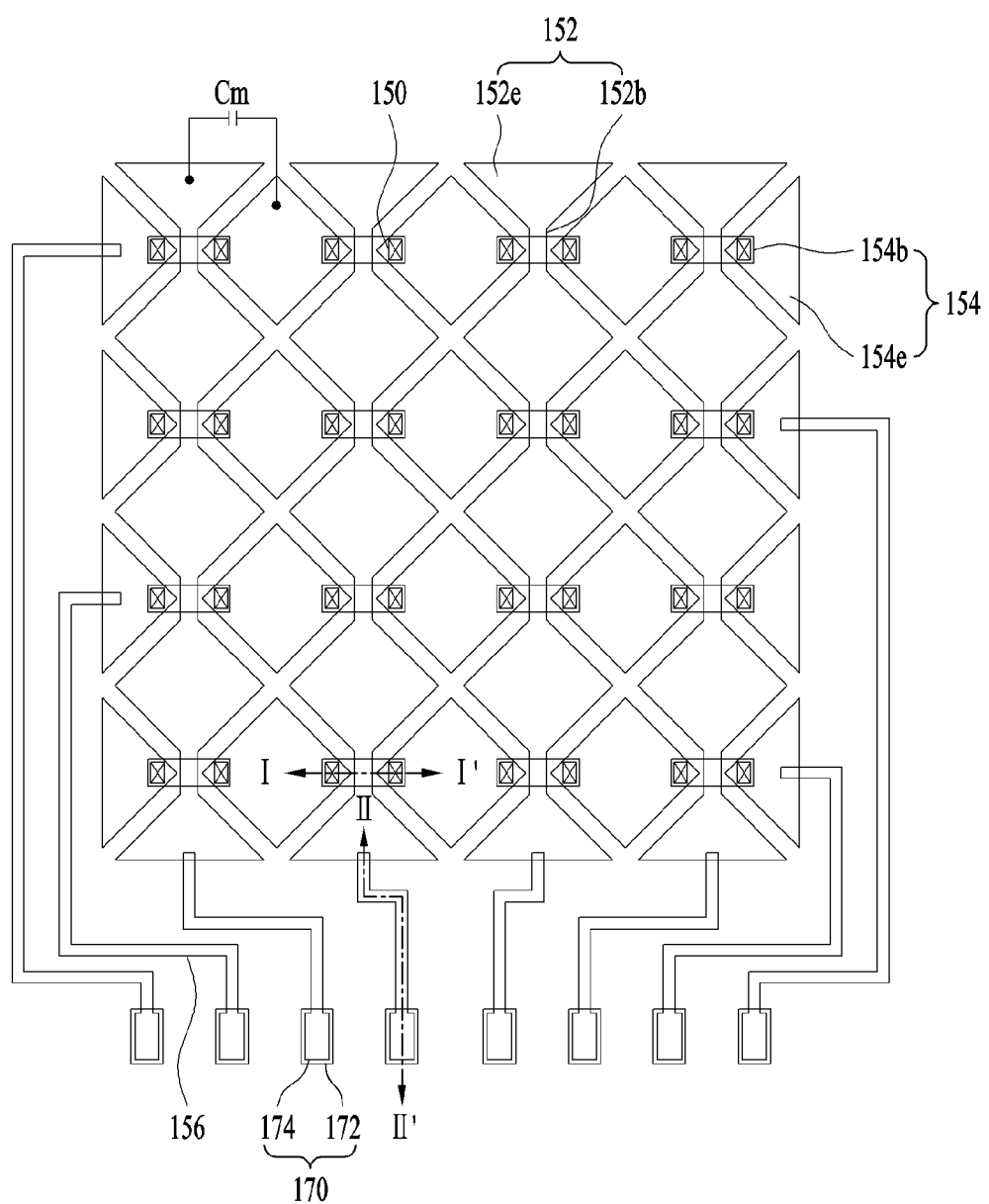
FIG. 2 is a plan view illustrating the organic light emitting display device with a touch sensor shown in FIG. 1.

FIGS. 1 and 2 are a perspective view and a plan view illustrating an organic light emitting display device with a touch sensor according to an embodiment of the present disclosure, respectively.

The organic light emitting display device with a touch sensor illustrated in FIGS. 1 and 2 detects variation in mutual capacitance (Cm) by touch of a user through touch electrodes 152e and 154e during a touch period to sense presence of touch and position thereof. In addition, the organic light emitting display device with a touch sensor displays an image through a unit pixel including a light emitting device 120 during a display period. The unit pixel includes red (R), green (G) and blue (B) sub-pixels (PXL), or red (R), green (G), blue (B) and white (W) sub-pixels (PXL).

For this purpose, the organic light emitting display device shown in FIG. 1 includes a plurality of sub-pixels (PXL) disposed in the form of a matrix on a substrate 111, a encapsulation layer 140 disposed on the sub-pixels (PXL), and a touch sensor and a color filter 192 disposed on the encapsulation layer 140. The color filter 192 can be a single color filter layer that includes red R portions, green G portions and blue B portions.

Each of the sub-pixels (PXL) includes a pixel driving circuit and a light emitting device 120 connected to the pixel driving circuit.

The pixel driving circuit includes a switching transistor (T1), a driving transistor (T2) and a storage capacitor (Cst).

The switching transistor (T1) is turned on when a scan pulse is supplied to a scan line (SL) and supplies a data signal supplied to a data line (DL) to the storage capacitor (Cst) and a gate electrode of the driving transistor (T2).

In response to the data signal supplied to the gate electrode of the driving transistor (T2), the driving transistor (T2) controls a current (I) supplied from a high-voltage power (VDD) line to the light emitting device 120, thereby regulating the amount of light emitted by the light emitting device 120. In addition, although the switching transistor (T1) is turned off, the driving transistor (T2) supplies a predetermined current (I) by the voltage charged in the storage capacitor (Cst) until a data signal of the next frame is supplied, thereby maintaining light emission of the light emitting device 120.

Figure 3:
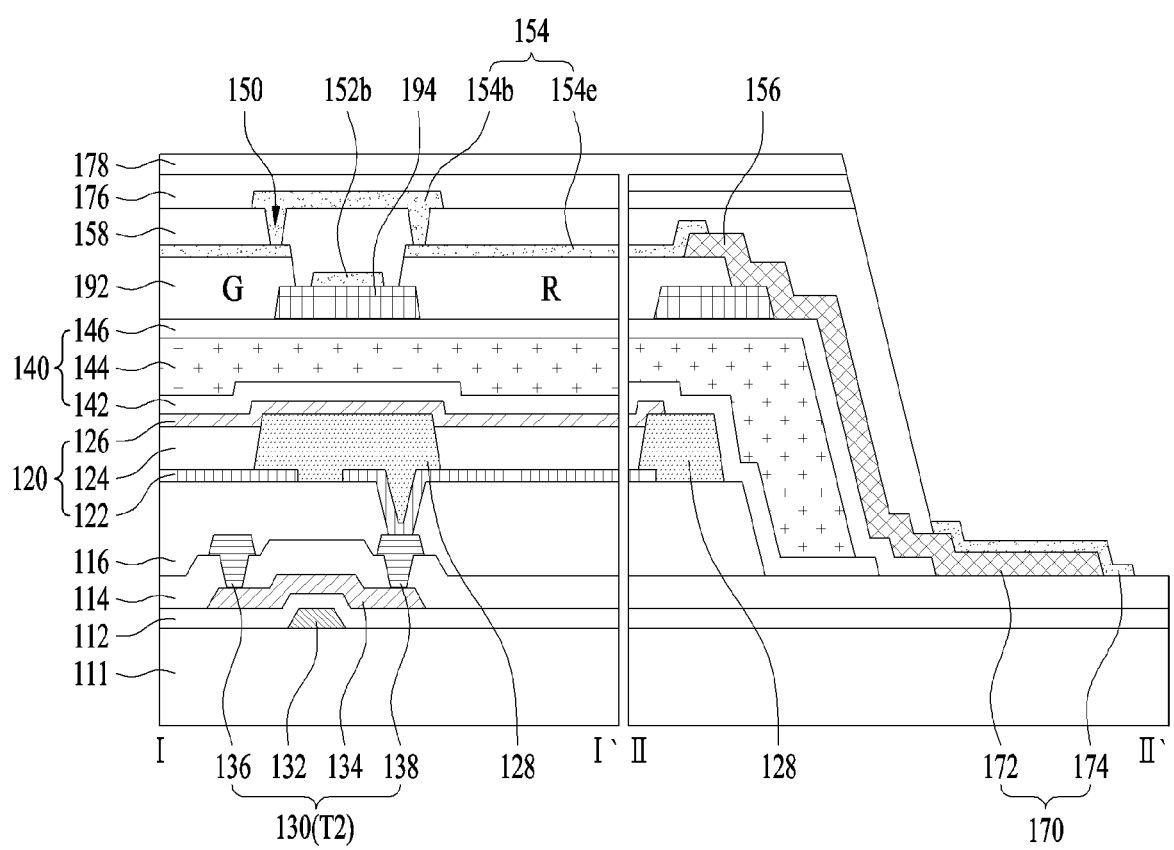
FIG. 3 is a sectional view illustrating the organic light emitting display device with a touch sensor taken along lines I-I and II-II of FIG. 2.

As illustrated in FIG. 3, the driving transistors (T2) 130 include a gate electrode 132, a semiconductor layer 134 overlapping the gate electrode 132 via a gate insulation layer 112, and source and drain electrodes 136 and 138 formed on the protective insulation layer 114 and contacting the semiconductor layer 134.

The light emitting device 120 includes an anode 122, at least one light emitting stack 124 formed on the anode 122, and a cathode 126 formed on the light emitting stack 124. In one embodiment, the light emitting device 120 is an organic light emitting diode (OLED) that converts electric energy into light.

The anode 122 is electrically connected to a drain electrode 138 of the driving transistor 130 exposed through a pixel contact hole passing through a planarization layer 116. The light emitting stack 124 is formed on the anode 122 of a light emission region provided by a bank 128. Each of at least one light emitting stack 124 is formed by stacking a hole-related layer, an organic light emitting layer and an electron-related layer in order or reverse order on the anode 122 and generates white light incident upon the color filter 192. For example, the light emitting stack 124 includes first and second light emitting stacks facing each other via a charge generation layer. In this case, any one light emitting layer of the first and second light emitting stacks generates blue light, and the other light emitting layer of the first and second light emitting stacks generates yellow-green light, thereby generating white light through the first and second light emitting stacks. The cathode 126 faces the anode 122 via the light emitting stack 124.

The encapsulation layer 140 blocks permeation of exterior moisture or oxygen to the light emitting device 120 that is vulnerable thereto. For this purpose, the encapsulation layer 140 includes a plurality of inorganic encapsulation layers 142 and 146, and an organic encapsulation layer 144 interposed between the inorganic encapsulation layers 142 and 146, wherein the inorganic encapsulation layer 146 is disposed as an uppermost layer. In this case, the encapsulation layer 140 includes at least two inorganic encapsulation layers 142 and 146, and at least one organic encapsulation layer 144. An example of the encapsulation layer 140 having a structure in which the organic encapsulation layer 144 is disposed between the first and second inorganic encapsulation layers 142 and 146 will be described.

The first inorganic encapsulation layer 142 is formed on the substrate 101 provided with the cathode 126 such that it is the closest to the light emitting device 120. The first inorganic encapsulation layer 142 is formed using an inorganic insulating material that can be deposited at a low temperature, such as silicon nitride ($SiN_x$), silicon oxide ($SiO_x$), silicon oxynitride (SiON) or aluminum oxide ($Al_2O_3$). Accordingly, since the first inorganic encapsulation layer 142 is deposited at a low temperature, it is possible to prevent damage to the organic light emitting layer of the light emitting stack 124 vulnerable to high temperatures upon deposition of the first inorganic encapsulation layer 142.

The organic encapsulation layer 144 functions as a buffer reducing stress between the respective layers resulting from the bending of the organic light emitting display and improves planarization performance. The organic encapsulation layer 144 is formed using an organic insulating material such as an acrylic resin, an epoxy resin, polyimide, polyethylene or silicon oxycarbide (SiOC).

The second inorganic encapsulation layer 146 is formed on the substrate 111 provided with the organic encapsulation layer 144 such that it covers the upper and side surfaces of each of the organic encapsulation layer 144 and the first inorganic encapsulation layer 142. Accordingly, the second inorganic encapsulation layer 146 minimizes or prevents permeation of exterior moisture or oxygen into the first inorganic encapsulation layer 142 and the organic encapsulation layer 144. The second inorganic encapsulation layer 146 is formed using an inorganic insulating material such as silicon nitride ($SiN_x$), silicon oxide ($SiO_x$), silicon oxynitride (SiON) or aluminum oxide ($Al_2O_3$).

The color filter 192 and the touch sensor are disposed on the encapsulation layer 140. The color filter 192 is between the encapsulation layer 140 and the touch sensor (e.g. 152 and 154).

The color filter 192 is directly disposed on the encapsulation layer 140 such that it overlaps the light emitting region provided by the bank 128. Accordingly, white light generated in the light emitting device 120 is emitted through the color filter 192 to realize a color image. Meanwhile, the color filter 192 is formed using a material that can be produced at a low temperature (about 100 degrees Celsius or less) to protect the light emitting stack 124, which is vulnerable to high temperatures.

The color filter 192 is directly disposed on and contacts the encapsulation layer 140 covering the light emitting devices 120. In this case, since the color filter 192 and the light emitting devices 120 are disposed on the same substrate 111, the present disclosure does not need an additional joining process, thus simplifying the overall process and reducing manufacturing costs. On the other hand, since a related organic light emitting display has a structure in which the color filter 192 and the light emitting devices 120 are disposed on different substrates, it needs a process of joining a substrate provided with the color filter 192 to a substrate provided with the light emitting devices 120, thus having problems of increased process complexity and manufacturing costs.

As such, a black matrix 194 is disposed between individual sub-pixel regions of the color filter 192 according to the present disclosure to divide respective sub-pixel regions and prevent light interference between adjacent sub-pixel regions and light leakage. In this case, the black matrix 194 overlaps the bank 128 between the sub-pixel regions. The black matrix 194 is formed using a high-resistance black insulating material or is formed by stacking at least two color filters among red (R), green (R) and blue (B) color filters 192.

A touch sensor which includes multiple touch sensing lines 154 and a touch driving lines 152 crossing each other via a touch insulating layer 158 is disposed on the substrate 111 provided with the color filter 192 and the black matrix 194. For example, the touch sensing line 154 and the touch driving line 152 are disposed on the color filter 192.

The touch driving line 152 includes a plurality of first touch electrodes 152e, and first bridges 152b for electrically connecting the first touch electrodes 152e to one another.

The first touch electrodes 152e are spaced from one another by a predetermined distance along a Y direction on the color filter 192 and the black matrix 194, or the color filter 192. Each of the first touch electrodes 152e is electrically connected to an adjacent first touch electrode 152e through a first bridge 152b.

The first bridge 152b is disposed on the black matrix 194 and is electrically connected to the first touch electrode 152e without an additional contact hole.

The touch sensing line 154 includes a plurality of second touch electrodes 154e, and second bridges 154b for electrically connecting the second touch electrodes 154 to one another.

The second touch electrodes 154e are spaced from one another by a predetermined distance along an X direction on the color filter 192 and the black matrix 194, or the color filter 192. Each of the second touch electrodes 154e is electrically connected to an adjacent second touch electrode 154e through a second bridge 154b.

The second bridge 154b is formed on the touch insulation layer 158 and is electrically connected to the second touch electrode 154e exposed by the touch contact hole 150 passing through the touch insulation layer 158. Similar to the first bridge 152b, the second bridge 154b overlaps the bank 128, thus preventing deterioration of opening ratio by the first and second bridges 152b and 154b.

As such, the touch sensing lines 154 intersect one another via the touch driving line 152 and the touch insulation layer 158 to form a mutual capacitance (Cm) at the intersection between the touch sensing line 154 and the touch driving line 152. The mutual capacitance (Cm) is charged with electric charge by a touch driving pulse supplied to the touch driving line 152 and discharges the electric charge to the touch sensing line 154.

Meanwhile, the touch driving line 152 and the touch sensing line 154 according to the present disclosure are electrically connected to a touch driving part (not shown) through a routing line 156 and a touch pad 170, respectively.

Accordingly, the routing line 156 transmits a touch driving pulse generated in the touch driving part through the touch pad 170 to the touch driving line 152, and transmits a touch sensing signal from the touch sensing line 154 to the touch pad 170. The routing line 156 is disposed between each of the first and second touch electrodes 152e and 154e, and the touch pad 170, and is electrically connected to each of the first and second touch electrodes 152e and 154e, without an additional contact hole.

As shown in FIG. 2, the routing line 156 connected to the first touch electrode 152e extends along at least one side of upper and lower sides of an active region and is connected to the touch pad 170. The routing line 156 connected to the second touch electrode 154e extends along at least one side of left and right sides of the active region and is connected to the touch pad 170. Meanwhile, the disposition of the routing line 156 is not limited to the structure shown in FIG. 2 and is variably changed depending on the design specifications of the display.

As shown in FIG. 3, the routing line 156 slopes downwards at an angle towards the substrate 111 and touch pad 170. The sloped portion of the routing line at least partially covers a side surface of the encapsulation layer 140 and is in direct contact with the side surface of the encapsulation layer 140. The routing line 156 also has a stepped shape that follows the shape of the underlying layers that the routing line 156 is in contact with.

The routing line 156 is formed as a monolayer or multilayer structure using a first conductive layer with excellent corrosion resistance, acid resistance and conductivity such as Al, Ti, Cu or Mo. For example, the routing line is formed as a three-layer stack structure such as Ti/Al/Ti or Mo/Al/Mo, or is formed as a multilayer structure including a transparent conductive layer with excellent corrosion resistance and acid resistance, such as ITO or IZO, and a non-transparent conductive layer with excellent conductivity, such as Ti/Al/Ti or Mo/Al/Mo.

The touch pad 170 is in a non-display area of the display device and is electrically connected to the touch sensor (e.g. 154 and 152) via the routing line 156. The touch pad 170 includes a pad electrode 172, and a pad cover electrode 174 formed on the pad electrode 172 such that the pad cover electrode 174 covers the pad electrode 172. The pad electrode 172 is in direct contact with the protective insulation layer 114. In some embodiments, the pad electrode 172 may be in direct contact with the gate insulation layer 112. The gate insulation layer 112 and protective insulation layer 114 are both located between the substrate 111 and the encapsulation layer 140.

The pad electrode 172 extends from the routing line 156 and is formed using the same material as the routing line 156. The pad cover electrode 174 is formed using the same material as the second bridge 154b and is disposed to cover the pad electrode 172 exposed by the touch insulation layer 158. The pad cover electrode 174 is formed to be exposed by the touch barrier layer 176 so that it can be connected to a touch driving part.

Here, the touch barrier layer 176 is formed to cover the touch sensing line 154 and the touch driving line 152, thereby preventing damage to the light emitting devices 120 as well as the touch sensing line 154 and the touch driving line 152 by exterior moisture or the like. The touch barrier layer 176 is formed by coating an organic insulating layer with an inorganic insulating layer. An optical film 178 such as a circular polarizer or brightness improvement film (OLED transmittance controllable film, OTF) may be disposed on the touch barrier layer 176.

As such, the organic light emitting display with a touch sensor according to the first embodiment of the present disclosure has a structure in which the touch electrodes 152e and 154e are formed on the encapsulation layer 140 during manufacturing of the display. Accordingly, as compared to a related organic light emitting display in which a touchscreen is attached to the organic light emitting display by an adhesive agent, an embodiment of the present disclosure does not require an adhesion process, thus simplifying the manufacturing process and reducing manufacturing costs.

All the layers shown in FIG. 3 as formed on a single substrate 111. In one embodiment, substrate 111 may be the only substrate in the display device.

Figure 4:
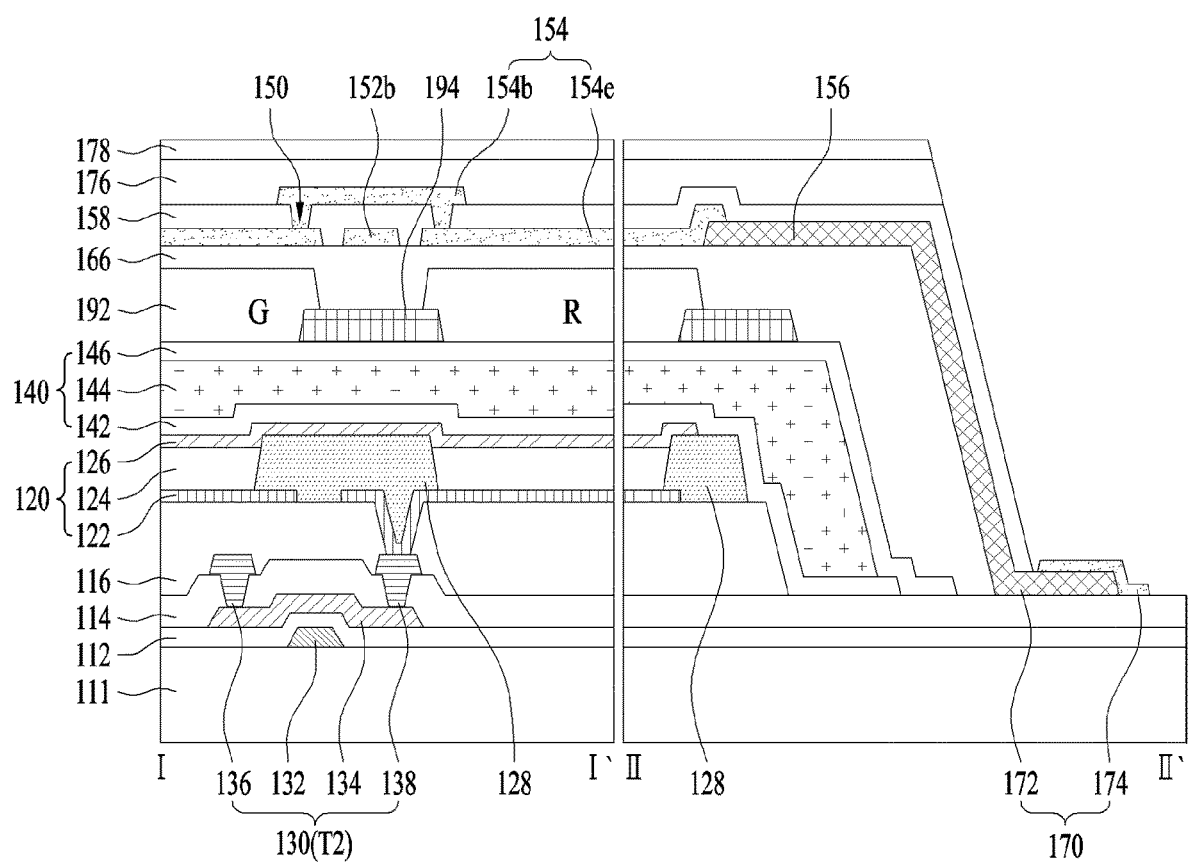
FIG. 4 is a sectional view illustrating an organic light emitting display device with a touch sensor according to a second embodiment of the present disclosure.

FIG. 4 is a sectional view illustrating an organic light emitting display with a touch sensor according to a second embodiment of the present disclosure.

The organic light emitting display with a touch sensor illustrated in FIG. 4 includes the same elements as the organic light emitting display illustrated in FIG. 3, except that the organic light emitting display further includes a touch buffer layer 166 interposed between each of the color filter 192 and the black matrix 194, and the touch electrodes 152e and 154e. Accordingly, detailed description of the same elements will be omitted.

The touch buffer layer 166 is formed on the color filter 192 and the black matrix 194 so as to cover the color filter 192 and the black matrix 194. The first and second touch electrodes 152e and 154e, and the first bridge 152b are formed on the touch buffer layer 166. The location of the touch buffer layer 166 causes it to be between the touch electrodes 152e and 154e and lower layers such as the color filter 192 and encapsulation layer 140.

In this case, the touch buffer layer 166 is formed to have a thickness of about 500 Å to 5 μm and the distance between each of the touch sensing line 154 and the touch driving line 152, and the cathode 126 is maintained at 5 μm or more. Accordingly, the capacitance of a parasitic capacitor formed between each of the touch sensing line 154 and the touch driving line 152, and the cathode 126 can be minimized and mutual capacitive effect caused by capacitive coupling between each of the touch sensing line 154 and the touch driving line 152, and the cathode 126 can thus be prevented. Meanwhile, when the distance between each of the touch sensing line 154 and the touch driving line 152, and the cathode 126 is less than 5 μm, touch performance is deteriorated due to mutual capacitance effect caused by capacitive coupling between each of the touch sensing line 154 and the touch driving line 152, and the cathode 126.

In addition, the touch buffer layer 166 prevents permeation of a reagent (such as a developing solution or etching solution) used for manufacturing the touch sensing line 154 and the touch driving line 152 or exterior moisture from penetrating into the light emitting stack 124. Accordingly, the light emitting stack 124, which is vulnerable to the reagent or moisture, is protected by the touch buffer layer 166 and damage to the light emitting stack 124 can be prevented.

In order to prevent damage to the light emitting stack 124, which is vulnerable to high temperatures, the touch buffer layer 166 can be formed using an organic insulating material which can be formed at a low temperature of 100 degrees Celsius (° C.) or less and has a low dielectric constant of 1 to 3. For example, the touch buffer layer 166 is formed using an acrylic, epoxy or siloxane material. The touch buffer layer 166 prevents damage to the respective sealing layers 142, 144 and 146 inside the encapsulation layer 140, resulting from bending of the organic light emitting display and also prevents breakage of the touch sensing line 154 and the touch driving line 152 formed on the touch buffer layer 166. The touch buffer layer 166 also serves as a planarization layer.

Additionally, the routing line 156 at least partially covers both the side surface of the encapsulation layer 140 and the side surface of the touch buffer layer 166. The sloped portion of the routing line 156 extends downwards along the side surface of the touch buffer layer 166, and is in direct contact with the side surface of the touch buffer layer 166.

As such, the organic light emitting display with a touch sensor according to the second embodiment of the present invention has a structure in which the touch electrodes 152e and 154e are formed on the encapsulation layer 140 during manufacturing of the display. Accordingly, as compared to a conventional organic light emitting display in which the touchscreen is attached to the organic light emitting display by an adhesive agent, the present invention does not require an adhesion process, thus simplifying the manufacturing process and reducing manufacturing costs.

In addition, the organic light emitting display with a touch sensor according to the present invention has a structure in which the color filter 192 is formed on the encapsulation layer 140 during manufacturing of the display. Thus, an embodiment of the present disclosure does not require a sealant to join a separate substrate on which the color filter 192 and touch sensor are disposed. This allows the display to be thinner.

In addition, the organic light emitting display with a touch sensor according to the second embodiment of the present disclosure can prevents=damage to the light emitting stack 124 through the touch buffer layer 166 interposed between the color filter 192 and the touch electrodes and can also reduce the capacitance of the parasitic capacitor formed by the cathode 126 and each of the touch electrodes 152e and 154e.

Figure 5:
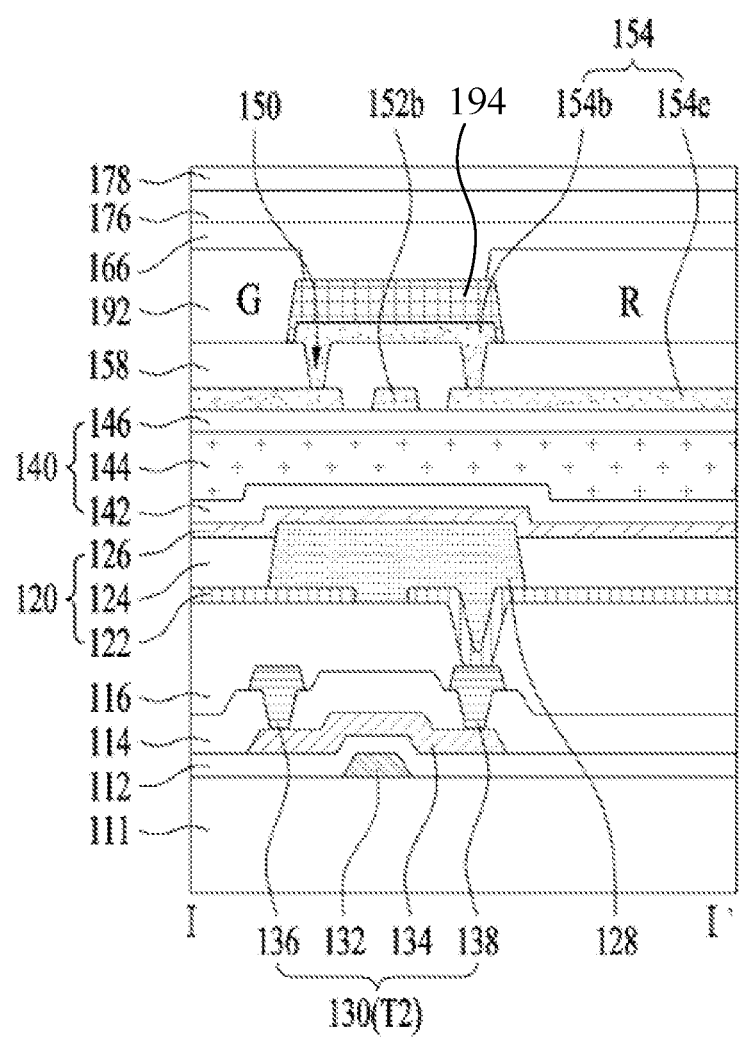
FIG. 5 is a sectional view illustrating an organic light emitting display device with a touch sensor according to a third embodiment of the present disclosure.

FIG. 5 is a sectional view illustrating an organic light emitting display with a touch sensor according to a third embodiment of the present disclosure.

The organic light emitting display illustrated in FIG. 5 includes the same elements as the organic light emitting display illustrated in FIG. 4, except that the color filter 192 is formed on the touch electrodes 152e and 154e. Accordingly, detailed description of the same elements will be omitted.

The color filter 192 and the black matrix 194 illustrated in FIG. 5 cover the touch sensor. That is, the touch sensing line 154 and the touch driving line 152 included in the touch sensor are disposed between the color filter 192 and the encapsulation layer 140. In this case, the color filter 192 and the black matrix 194, which are disposed higher than the touch sensor, absorb exterior light incident from the outside of the organic light emitting display to the inside thereof. That is, it is possible to prevent reflection of exterior light by conductive layers (for example, bridges 152b and 154b, an anode 122, a gate electrode 132, and source and drain electrodes 136 and 138) formed using a metal with high reflectivity included in the touch sensor, the light emitting device 120 and the driving transistor 130, and thus deterioration of visibility by exterior light. Accordingly, the organic light emitting display shown in FIG. 5 can prevent deterioration of visibility due to exterior light even without an additional circular polarizer, and can thus reduce costs owing to removal of the circular polarizer.

In addition, the touch buffer layer 166 is formed on the substrate 111 provided with the color filter 192 and the black matrix 194. The touch buffer layer 166 is formed using an organic insulating material such as an acrylic resin, an epoxy resin, polyimide, polyethylene or silicon oxycarbide (SiOC). The touch buffer layer 166 formed using the organic insulating material planarizes the substrate 111 provided with the color filter 192 and the black matrix 194, thus improving adhesion of the barrier film 176 and the optical film 178 to the touch buffer layer 166.

As such, the organic light emitting display with a touch sensor according to the third embodiment has a structure in which the touch electrodes 152e and 154e are directly disposed on the encapsulation layer 140. Accordingly, as compared to a conventional organic light emitting display in which the touchscreen is attached to the organic light emitting display by an adhesive agent, an embodiment of the present disclosure does not require an adhesion process, thus simplifying the manufacturing process and reducing manufacturing costs.

Additionally, the organic light emitting display with a touch sensor according to the present disclosure absorbs exterior light through the color filter 192 and the black matrix 194 covering the light emitting device 120 and the touch sensor, thus preventing deterioration of visibility due to exterior light.

Figure 6:
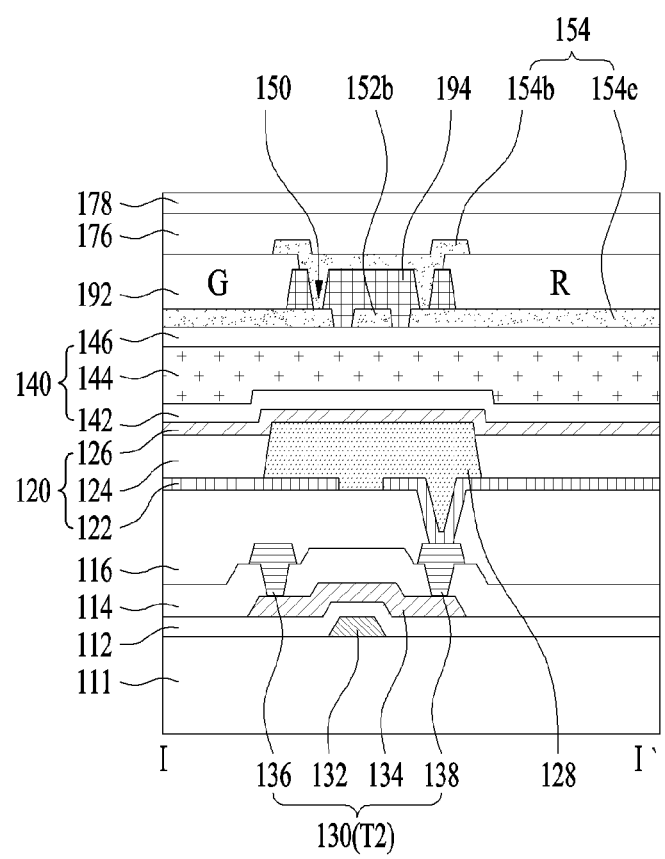
FIG. 6 is a sectional view illustrating an organic light emitting display device with a touch sensor according to a fourth embodiment of the present disclosure.

FIG. 6 is a sectional view illustrating an organic light emitting display with a touch sensor according to a fourth embodiment of the present disclosure.

The organic light emitting display illustrated in FIG. 6 includes the same elements as the organic light emitting display illustrated in FIG. 4, except that at least one of the black matrix 194 and the color filter 192 is used as the touch insulation layer. Accordingly, detailed description of the same elements will be omitted.

The touch sensing line 154 and the touch driving line 152 of the organic light emitting display illustrated in FIG. 6 intersect each other via at least one of the color filter 192 and the black matrix 194. Accordingly, the first bridge 152b and the first touch electrode 152e of the touch driving line 152, and the second touch electrode 154e of the touch sensing line 154 are formed on the sealing layer 140, and the second bridge 154b is formed on the color filter 192 and the black matrix 194. The second bridge 154b is electrically connected to the second touch electrode 154e exposed by the touch contact hole 150 passing through the black matrix 194. As such, the first and second bridges 152b and 154b are insulated through the black matrix 194 without an additional touch insulation layer, thereby realizing a thin film, omitting the manufacturing process of the touch insulation layer, simplifying the overall process and reducing manufacturing costs.

Meanwhile, although FIG. 6 illustrates an example in which the touch contact hole 140 passes through the black matrix 194, the touch contact hole 150 may pass through the color filter 192, or may pass through the color filter 192 and the black matrix 194 depending on the design specifications of the display.

Figure 7:
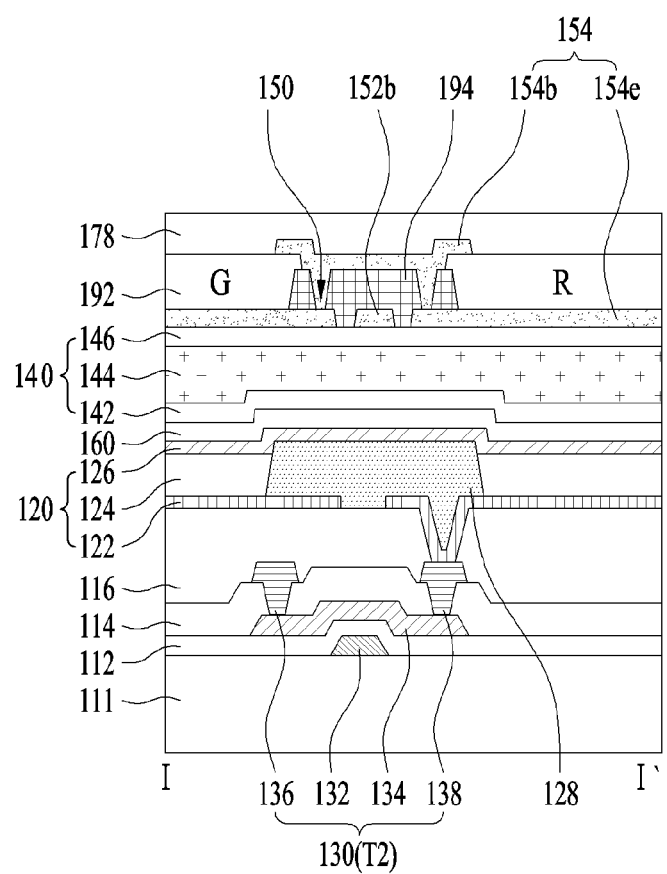
FIG. 7 is a sectional view illustrating an organic light emitting display device with a touch sensor according to a fifth embodiment of the present disclosure.

FIG. 7 is a sectional view illustrating an organic light emitting display with a touch sensor according to a fifth embodiment of the present disclosure.

The organic light emitting display illustrated in FIG. 7 includes the same elements as the organic light emitting display illustrated in FIG. 6, except that the touch barrier film 176 is omitted and a barrier thin film layer 160 is provided. Accordingly, detailed description of the same elements will be omitted.

The barrier thin film layer 160 is formed between the uppermost layer of the encapsulation layer 140 and the touch electrodes 152e and 154e (not shown), or between the light emitting device 120 and the lowermost layer of the encapsulation layer 140 (shown in FIG. 7). For example, the barrier thin film layer 160 is formed between the cathode 126 and the first inorganic sealing layer 142 disposed as the lowermost layer of the encapsulation layer 140. The barrier thin film layer 160 is formed as an inorganic layer that can be formed by atomic layer deposition (ALD) at a low temperature and is formed using an inorganic insulating material such as silicon nitride ($SiN_x$), silicon oxide ($SiO_x$), silicon oxynitride (SiON) or aluminum oxide ($Al_2O_3$). Accordingly, the barrier thin film layer 160 prevents permeation of exterior moisture or oxygen into the light emitting device 120 vulnerable to exterior moisture or oxygen, thereby omitting an additional touch barrier film. In addition, the barrier thin film layer 160 is formed by low-temperature deposition, thus preventing damage to the light emitting stack 124, which is vulnerable to high temperature.

FIGS. 8A to 8D are sectional views illustrating a method of manufacturing organic light emitting displays with a touch sensor according to first to fifth embodiments of the present disclosure. Herein, the structure of the second embodiment according to the present disclosure illustrated in FIG. 4 will be described as an example.

Figure 8A:
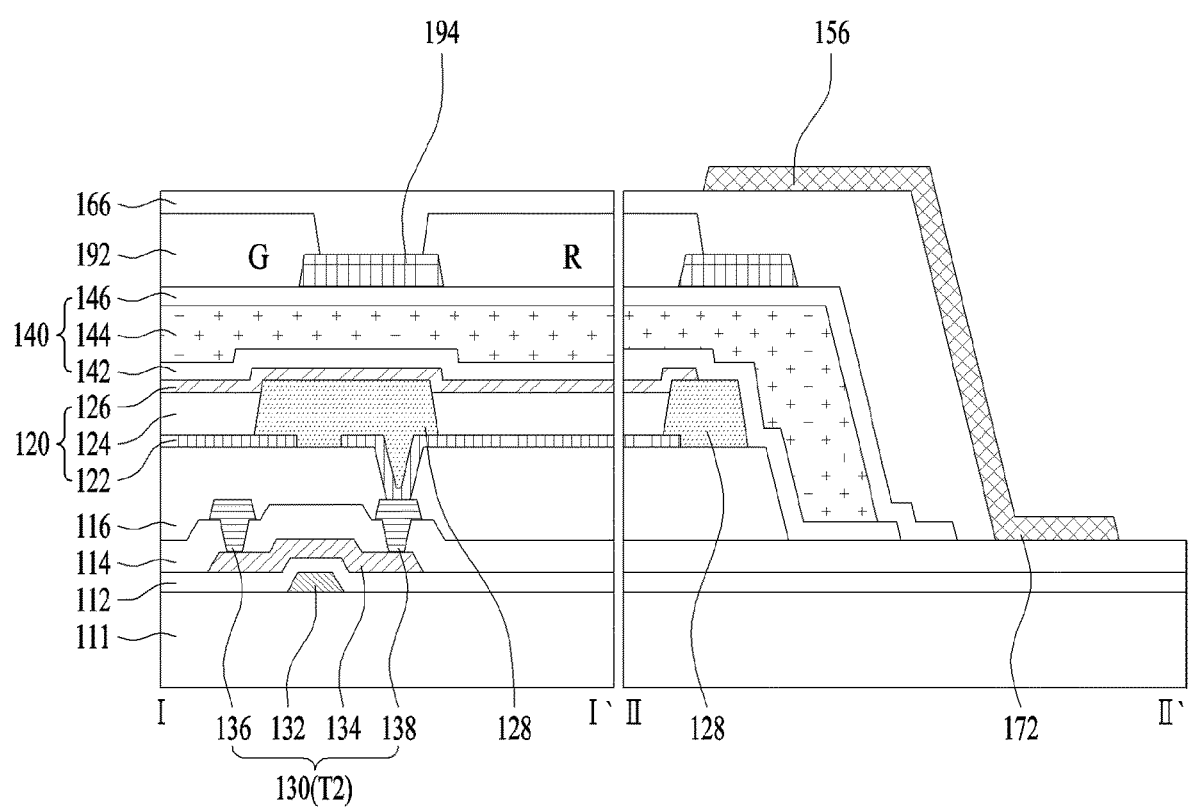
FIGS. 8A to 8D are sectional views illustrating a method of manufacturing the organic light emitting display device with a touch sensor shown in FIG. 4.

Referring to FIG. 8A, a routing line 156 and a pad electrode 172 are formed on a substrate 111 provided with a switching transistor, a driving transistor 130, a light emitting device 120, a encapsulation layer 140, a black matrix 194, a color filter 192 and a touch buffer layer 166.

Specifically, the first conductive layer is deposited at room temperature by deposition using sputtering over the entire surface of the substrate 111 provided with the switching transistor, the driving transistor, the light emitting device 120, the encapsulation layer 140, the black matrix 194, the color filter 192 and the touch buffer layer 166, and the first conductive layer is then patterned by photolithography and etching to form the routing line 156 and the pad electrode 172. Here, the first conductive layer is formed as a monolayer or multilayer structure using a metal with excellent corrosion resistance and acid resistance, such as Al, Ti, Cu, or Mo. For example, the first conductive layer is formed as a three-layer stack structure such as Ti/Al/Ti or Mo/Al/Mo.

Figure 8B:
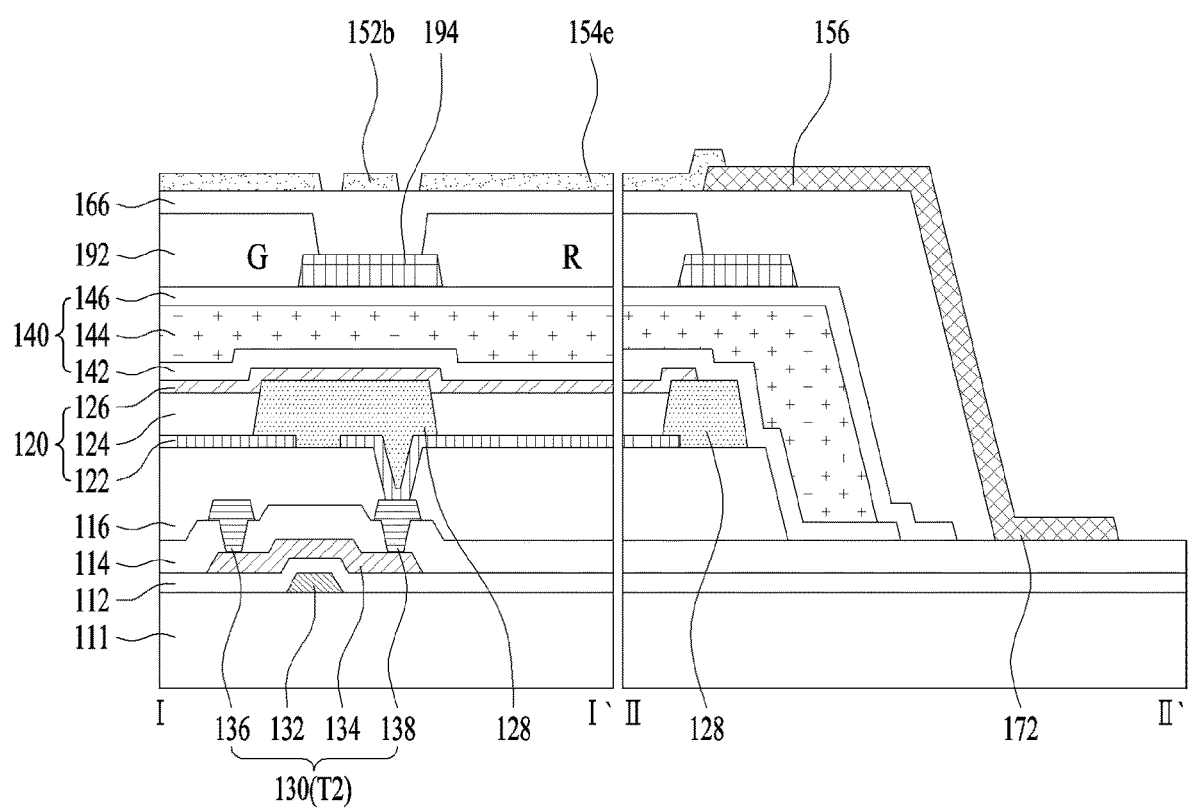

Referring to FIG. 8B, first and second touch electrodes 152e and 154e and a first bridge 152b are formed on the substrate 111 provided with the routing line 156 and the pad electrode 172.

Specifically, the second conductive layer is deposited over the entire surface of the substrate 111 provided with the routing line 156 and the pad electrode 172. Here, in a case in which a transparent conductive layer, such as ITO or IZO, is used as the second conductive layer, the transparent conductive layer is formed at room temperature by deposition such as sputtering. Then, the second conductive layer is patterned by photolithography and etching to form first and second touch electrodes 152e and 154e and a first bridge 152b.

Figure 8C:
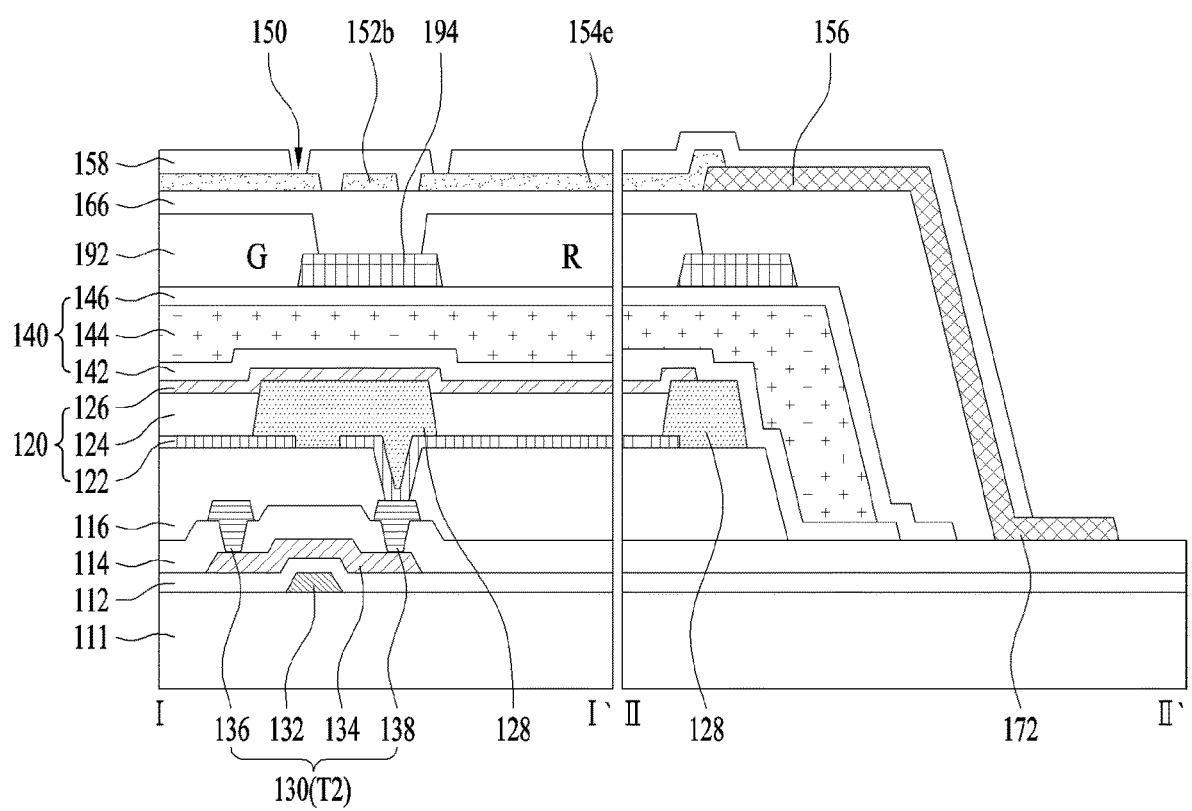

Referring to FIG. 8C, a touch insulation layer 158 having a touch contact hole 150 is formed on the substrate 111 provided with the first and second touch electrodes 152e and 154e, and the first bridge 152b.

Specifically, a touch insulation layer 158 is formed to have a thickness of 500 Å to 5 μm on the substrate 111 provided with the first and second touch electrodes 152e and 154e, and the first bridge 152b. Here, in a case in which an organic layer is used as the touch insulation layer 158, the organic layer is coated on the substrate and is then cured at a temperature of 100 degrees Celsius or less, to form a touch insulation layer 158. In a case in which an inorganic layer is used as the touch insulation layer 158, low-temperature CVD deposition and washing processes were repeated at least twice to form a touch insulation layer 158 with a multilayer structure. Then, the touch insulation layer 158 is patterned by photolithography and etching to form a touch contact hole 150.

Figure 8D:
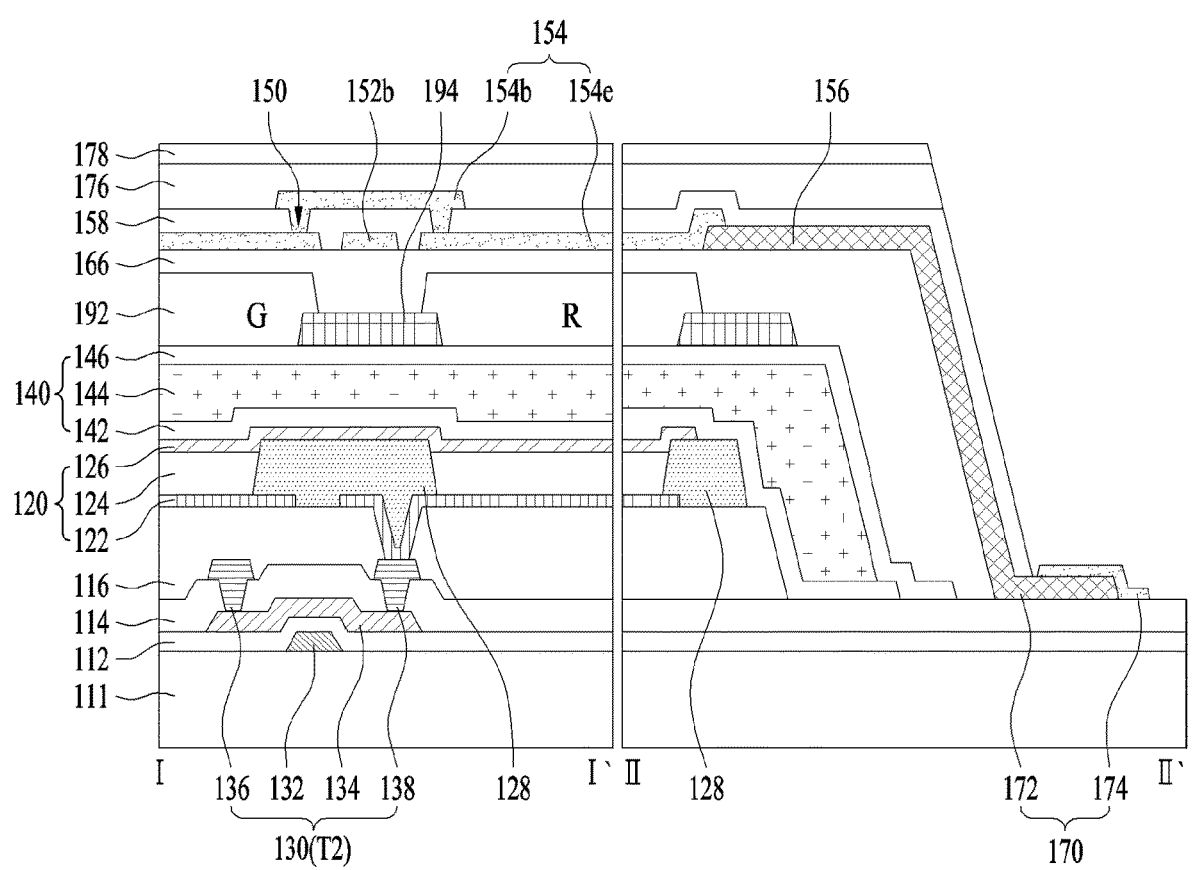

Referring to FIG. 8D, a second bridge 154b and a pad cover electrode 174 are formed on the substrate 111 provided with the touch insulation layer 158 having the touch contact hole 150.

Specifically, a third conductive layer is formed on the substrate 111 provided with the touch insulation layer 158 having the touch contact hole 150. Here, in a case in which a transparent conductive layer such as ITO or IZO, or a metal with excellent corrosion resistance and acid resistance such as Al, Ti, Cu or Mo is used as the third conductive layer, the third conductive layer is formed at room temperature by deposition such as sputtering. Then, the third conductive layer is patterned by photolithography and etching to form a second bridge 154b and a pad cover electrode 174. Then, a touch barrier film 176 and an optical film 178 are attached to the substrate 111 provided with the second bridge 154b and the pad cover electrode 174.

Figure 9:
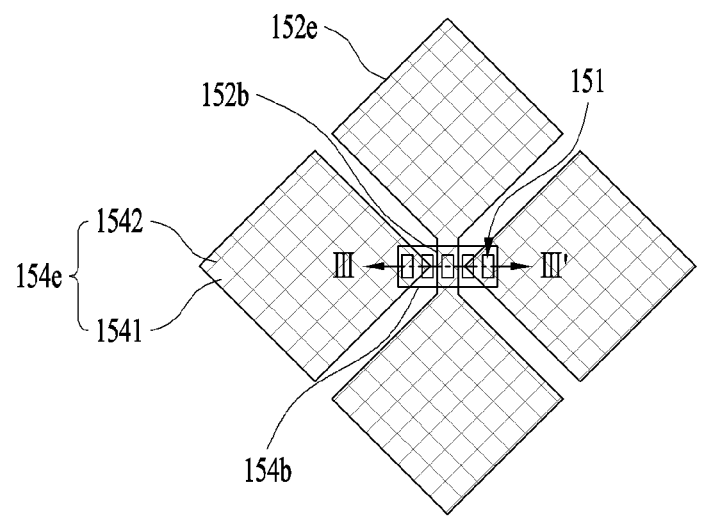
FIG. 9 is a sectional view illustrating touch electrodes and bridges according to another embodiment of the present disclosure.
Figure 9:
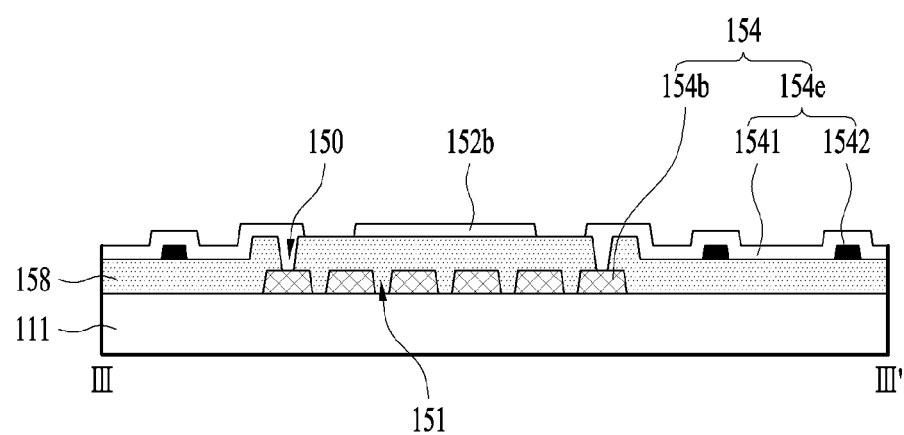

FIG. 9 is a plan view and a sectional view illustrating an organic light emitting display with a touch sensor according to a sixth embodiment of the present disclosure.

The organic light emitting display illustrated in FIG. 9 includes the same elements as the organic light emitting display illustrated in FIGS. 3 to 7, except that configurations of the first and second touch electrodes 152e and 154e are changed. Accordingly, detailed description of the same elements will be omitted.

Some layers of the first and second touch electrodes 152e and 154e illustrated in FIG. 9 may be formed to have a mesh shape. That is, the first and second touch electrodes 152e and 154e include a transparent conductive layer 1541, and a mesh metal layer 1542 having a mesh shaped pattern. The mesh metal layer 1542 is on or under the transparent conductive layer 1541. The mesh metal layer 1542 is formed by the same mask process as the routing line 156 using the same material as the routing line 156. Accordingly, the mesh metal layer 1542 prevents complication of the manufacturing process and an increase in manufacturing costs.

In addition, the touch electrodes 152e and 154e may be composed of only the mesh metal layer 1542 without the transparent conductive layer 1541, or may be formed of the transparent conductive layer 1541 in the form of a mesh without the mesh metal layer 1542. Here, the mesh metal layer 1542 may include touch electrodes 152e and 154e as low-resistance electrodes due to better conductivity than the transparent conductive layer 1541. In particular, when the transparent conductive layer 1541 is formed at a low temperature (about 100 degrees Celsius or less) in order to protect the light emitting stack 124, which is vulnerable to high temperatures, the transparent conductive layer 1541 cannot obtain high transparency and low resistance. In this case, transmittance can be improved by forming the transparent conductive layer 1541 to have a small thickness while reducing resistance of the touch electrodes 152e and 154e through the mesh metal layer 1542, which has high conductivity.

Accordingly, touch sensitivity can be improved due to decreased resistance and capacitance of touch electrodes 152e and 154e and thus reduced RC time constant. In addition, deterioration in opening ratio and transmittance resulting from very small line width of the mesh metal layer 1542 can be prevented.

In addition, as shown in FIG. 9, the bridge 154b disposed in a different plane from the touch electrodes 152e and 154e includes a plurality of slits 151. Accordingly, the bridge 154b including the slits 151 is reduced in area as compared to bridge 154b including no slits 151. Some of the slits 151 overlap with the bridge 152b. Accordingly, it is possible to reduce reflection of exterior light due to the bridge 154b and thus prevent deterioration of visibility. The bridge 154b including the slits 151 is formed as a transparent conductive layer or a non-transparent conductive layer. When the bridge 154b is formed as a non-transparent conductive layer, the bridge 154b overlaps the bank 128, thereby preventing deterioration in an opening ratio.

In FIG. 9, the display has a structure in which the bridge 154b and the second touch electrode 154e of the touch sensing line 154 are disposed in different planes and are connected through the touch contact hole 150. In this case, the method of manufacturing the organic light emitting display having a touch sensor according to the present disclosure is as follows. The second bridge 154b is formed by a first mask process, the touch insulation layer having the touch contact hole 150 is formed by a second mask process, the routing line and the mesh metal layer are formed by a third mask process, and the first bridge 152b, and the first and second touch electrodes 152e and 154e are formed by a fourth mask process. In other embodiments, the bridge 152b and the first touch electrode 152e of the touch driving line 152 may be disposed in different planes and be connected through the touch contact hole 150.

As apparent from the afore-going, the organic light emitting display with a touch sensor according to an embodiment of the present disclosure has a structure in which touch electrodes are formed on the encapsulation layer. Accordingly, as compared to a conventional organic light emitting display in which the touchscreen is attached to the organic light emitting display by an adhesive agent, an embodiment of the present disclosure does not require a joining process, thus simplifying the manufacturing process, reducing manufacturing costs, making the display easier to fold, and improving resolution and opening ratio.

In addition, the organic light emitting display with a touch sensor according to an embodiment of the present disclosure has a structure in which color filters are formed on the encapsulation layer. Accordingly, an embodiment of the present disclosure does not require a joining process, thus simplifying the manufacturing process, reducing manufacturing costs, making the display easier to fold, and improving resolution and opening ratio.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device comprising:
   at least one light emitting device on a substrate;
   an encapsulation layer on the at least one light emitting device;
   a bank disposed under the encapsulation layer;
   an insulating layer between the substrate and the encapsulation layer;
   a touch sensor on the encapsulation layer, the touch sensor having a touch sensing line and a touch driving line intersecting each other, the touch sensing line including:
      a plurality of touch electrodes on the encapsulation layer, and
      a bridge electrically connecting two or more touch electrodes in the plurality of touch electrodes;
   a color filter on the encapsulation layer, wherein at least a part of the color filter is on at least a part of the touch sensor;
   a black matrix located between adjacent sub-pixel regions of the color filter, wherein the black matrix is disposed on the touch sensor and contacts a portion of the touch electrodes at an area between adjacent color filters; and
   a touch pad electrically connected to the touch sensor and in contact with the insulating layer,
   wherein the touch sensor overlaps with the bank.

2. The display device of claim 1, further comprising:
   a routing line electrically connecting the touch pad to the touch sensor, wherein the routing line covers a side surface of the encapsulation layer.

3. The display device of claim 2, wherein the routing line is in contact with the side surface of the encapsulation layer.

4. The display device of claim 2, further comprising:
   a touch buffer layer between the encapsulation layer and the touch sensor,
   wherein the routing line covers a side surface of the touch buffer layer.

5. The display device of claim 1, wherein the color filter is on the touch sensor, and wherein the touch sensor is disposed between the color filter and the encapsulation layer.

6. The display device of claim 1, further comprising:
   a touch insulation layer located between the touch sensing line and the touch driving line.

7. The display device of claim 1, wherein the touch sensing line and the touch driving line intersect each other in an area corresponding to the black matrix.

8. The display device of claim 1,
   wherein the touch driving line comprises another plurality of touch electrodes connected to one another through another bridge.

9. The display device of claim 8, wherein at least one of the first and second touch electrodes comprises:
   a mesh metal layer have a mesh shaped pattern; and
   a transparent conductive layer located on or under the mesh metal layer.

10. The display device of claim 8, wherein at least one of the bridge and the another bridge comprises a slit.

11. The display device of claim 10, wherein the slit of the at least one of the bridge and the another bridge overlaps with the other one of the bridge and the another bridge.

12. The display device of claim 1, wherein the at least one light emitting device comprises:
    an anode disposed on the substrate;
    a cathode; and
    at least one light emitting stack disposed between the anode and the cathode.

13. A display device, comprising:
    at least one light emitting device on a substrate;
    an encapsulation layer on the at least one light emitting device;
    a bank disposed under the encapsulation layer;
    a touch sensor on the encapsulation layer, the touch sensor having a touch sensing line and a touch driving line intersecting each other, the touch sensing line including:
       a plurality of touch electrodes on the encapsulation layer, and
       a bridge electrically connecting two or more touch electrodes in the plurality of touch electrodes;
    a color filter on the encapsulation layer, wherein at least a part of the color filter is on at least a part of the touch sensor;
    a black matrix located between adjacent sub-pixel regions of the color filter, wherein the black matrix is disposed on the touch sensor and contacts a portion of the touch electrodes at an area overlapping the bank; and
    a routing line electrically connected to the touch sensor, the routing line covering a side surface of the encapsulation layer.

14. The display device of claim 13, wherein the routing line is in contact with the side surface of the encapsulation layer.

15. The display device of claim 13, further comprising:
    a touch buffer layer between the encapsulation layer and the touch sensor,
    wherein the routing line covers a side surface of the touch buffer layer.

16. The display device of claim 15, wherein the routing line is in contact with the side surface of the touch buffer layer.

17. The display device of claim 13, wherein the color filter is on the touch sensor, and wherein the touch sensor is disposed between the color filter and the encapsulation layer.

18. The display device of claim 13, further comprising:
    a touch insulation layer located between the touch sensing line and the touch driving line.

19. The display device of claim 13, wherein the touch sensing line and the touch driving line intersect each other in an area corresponding to the black matrix.

20. The display device of claim 13,
    wherein the touch driving line comprises another plurality of touch electrodes connected to one another through another bridge.

21. The display device of claim 20, wherein at least one of the first and second touch electrodes comprises:
    a mesh metal layer have a mesh shaped pattern; and
    a transparent conductive layer located on or under the mesh metal layer.

22. The display device of claim 20, wherein at least one of the bridge and the another bridge comprises a slit.

23. The display device of claim 22, wherein the slit of the at least one of the bridge and the another bridge overlaps with the other one of the bridge and the another bridge.

24. The display device of claim 13, wherein the at least one light emitting device comprises:
   an anode disposed on the substrate;
   a cathode; and
   at least one light emitting stack disposed between the anode and the cathode.

\* \* \* \* \*